(12) United States Patent
Talor et al.

(10) Patent No.: US 9,436,092 B2
(45) Date of Patent: Sep. 6, 2016

(54) SEMICONDUCTOR FABRICATION UTILIZING GRATING AND TRIM MASKS

(71) Applicant: Newport Fab, LLC, Newport Beach, CA (US)

(72) Inventors: George Talor, Mission Viejo, CA (US); Edward Preisler, San Clemente, CA (US); David J. Howard, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 13/712,005

(22) Filed: Dec. 12, 2012

(65) Prior Publication Data

US 2013/0256844 A1 Oct. 3, 2013

Related U.S. Application Data

(60) Provisional application No. 61/618,634, filed on Mar. 30, 2012.

(51) Int. Cl.
*G03F 7/20* (2006.01)
*H01L 21/66* (2006.01)
*H01L 29/06* (2006.01)
*G03F 1/30* (2012.01)

(52) U.S. Cl.
CPC .............. *G03F 7/203* (2013.01); *G03F 1/30* (2013.01); *G03F 7/2022* (2013.01); *G03F 7/70283* (2013.01); *H01L 22/12* (2013.01); *H01L 29/06* (2013.01)

(58) Field of Classification Search
CPC .. G03F 1/30; G03F 7/70283; G03F 7/70358; G03F 7/70466; G03F 9/7076; G03F 7/203; G03F 7/2022; G02F 1/133753; G02F 1/13378; G02F 1/1391; H01L 21/28123; H01L 21/76895; H01L 21/76897; H01L 21/823481; H01L 29/06; H01L 22/12
USPC ................................ 438/473, 708, 948–949
See application file for complete search history.

(56) References Cited

U.S. PATENT DOCUMENTS

| | | | | |
|---|---|---|---|---|
| 5,495,959 A | * | 3/1996 | Rolfson | G03F 1/29 216/12 |
| 2003/0129502 A1 | * | 7/2003 | Chen | G03F 1/144 430/5 |
| 2004/0185348 A1 | * | 9/2004 | Progler | G03F 1/30 430/5 |
| 2004/0241557 A1 | * | 12/2004 | Bellman et al. | 430/5 |
| 2004/0259042 A1 | * | 12/2004 | Fritze et al. | 430/394 |

* cited by examiner

*Primary Examiner* — Michelle Mandala
(74) *Attorney, Agent, or Firm* — Farjami & Farjami LLP

(57) ABSTRACT

Disclosed are a method for fabricating a semiconductor device and the associated semiconductor structure. The method includes exposing a photoresist layer disposed on a semiconductor wafer utilizing a grating mask having a plurality of grating lines to produce exposed lines and unexposed lines in the photoresist layer. The method further includes exposing the photoresist layer utilizing a trim mask having a blocking portion situated over a selected one of the unexposed lines. The photoresist layer may be developed after exposing the photoresist layer utilizing the trim mask. A line may then be etched into the semiconductor wafer where the selected one of the unexposed lines was blocked by the blocking portion of the trim mask. The width of the unexposed lines may be controlled by adjusting an exposure time or an exposure power for the photoresist layer while utilizing the grating mask.

20 Claims, 6 Drawing Sheets

Fig. 8

SEMICONDUCTOR FABRICATION UTILIZING GRATING AND TRIM MASKS

BACKGROUND

The present application claims the benefit of and priority to a pending provisional patent application entitled "Grating and Trim Masks to Produce Critical Dimensions in Semiconductor Fabrication," Ser. No. 61/618,634 filed on Mar. 30, 2012. The disclosure in that pending provisional application is hereby incorporated fully by reference into the present application.

As semiconductor devices, such as bipolar transistors, continue to decrease in size, smaller critical dimensions (CDs) are required for features within the devices. Advanced lithography techniques currently include 193 nanometer (nm) wavelength (deep ultraviolet or DUV) lithography and immersion lithography, for example. While such advanced lithography techniques may be applied to both bipolar transistors as well as CMOS transistors, the benefit in bipolar transistor performance does not outweigh the high cost involved with developing the sub-micron lithography techniques used in advanced CMOS nodes, for example, at or below the 45 nm node.

Traditional lithography techniques utilizing 248 nm deep ultraviolet exposure are sufficient to produce the line widths necessary to create satisfactory bipolar devices operating at up to 200 GHz. However, as the frequency of unity power gain $F_{max}$ for a particular transistor is driven past 200 GHz, the CDs of key features as well as their tolerances become more difficult to achieve. Specifically regarding bipolar transistors, the width of the collector implant window underneath the intrinsic emitter, and the width of the emitter poly contact pedestal above the intrinsic emitter, must be reduced as much as possible.

SUMMARY

The present disclosure is directed to semiconductor fabrication utilizing grating and trim masks, substantially as shown in and/or described in connection with at least one of the figures, and as set forth more completely in the claims.

DETAILED DESCRIPTION

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

The present inventive concepts utilize a grating mask to expose arrays of ultra-fine lines in a photoresist layer having CDs narrower than the capability of current lithography techniques. A second trim mask may then be applied over the array of ultra-fine lines in the photoresist layer to trim out neighboring exposed lines and to control the length of one or more of the ultra-fine lines. The use of such a two-step grating/trim mask technique may allow the formation of features having approximately half the CD possible with current binary-mask lithography techniques. For example, the present inventive concepts have proven capable of fabrication resolutions as small as approximately 50 nm.

Figure 1:
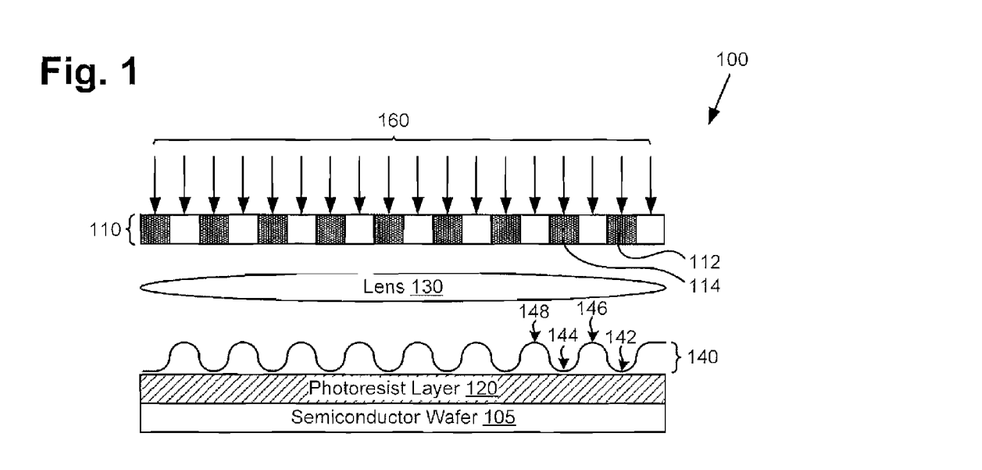
FIG. 1 presents an exemplary system for fabricating a semiconductor device, in accordance with one implementation of the present application.

FIG. 1 presents an exemplary system for fabricating a semiconductor device, in accordance with one implementation of the present application. System 100 may include semiconductor wafer 105 having photoresist layer 120 situated thereon. System 100 may also include exposure mask 110, which may be either a grating mask or a trim mask, for example. Where exposure mask 110 is a grating mask, exposure mask 110 may include several grating lines, such as exemplary grating lines 112 and 114. Lens 130 may be situated between exposure mask 110 and photoresist layer 120 in order to focus exposure radiation 160 onto photoresist layer 120 according to the pattern of exposure mask 110. Due to interference and diffraction effects of exposure radiation 160 passing through the grating lines of exposure mask 110, the intensity of exposure pattern 140 on photoresist layer 120 may include a series of low intensity regions 142, 144 and high intensity regions 146, 148. Though exposure pattern 140 is shown above photoresist layer 120, the actual exposure pattern will occur within photoresist layer 120. Regions of highest intensity will occur between the grating lines forming exposed lines in photoresist layer 120, while regions of lowest intensity will occur directly under the grating lines forming unexposed lines in photoresist layer 120.

Figure 2A:
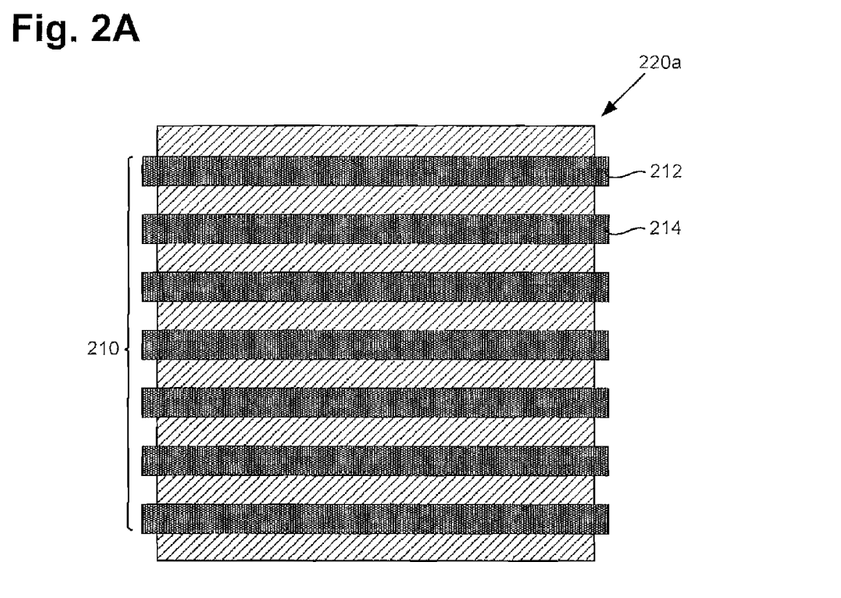
FIG. 2A illustrates an exemplary top view of a photoresist layer viewed through a grating mask and lens in accordance with one implementation of the present application.

FIG. 2A through 2D illustrate exemplary progressive top views of the fabrication of a feature having an ultra-fine critical dimension, in accordance with one implementation of the present application. Specifically, FIG. 2A illustrates an exemplary top view of a photoresist layer viewed through an exposure mask and lens as shown in FIG. 1, for example. FIG. 2A may include uniform photoresist layer 220a disposed on a semiconductor wafer (not shown), as in FIG. 1. Photoresist layer 220a may be either a negative or a positive photoresist. Where a positive photoresist is utilized, exposed portions of photoresist layer 220a will be removed during subsequent development. Where a negative photoresist is utilized, exposed portions of photoresist layer 220a will remain after subsequent development. A grating mask 210 may be situated over photoresist layer 220a and may include several closely spaced grating lines, for example grating lines 212 and 214. Each of the grating lines may include a layer of chrome, for example, for blocking exposure radiation during subsequent photoresist exposure. Once grating mask 210 is secured in place, photoresist layer 220a may be subjected to the appropriate exposure radiation.

Figure 2B:
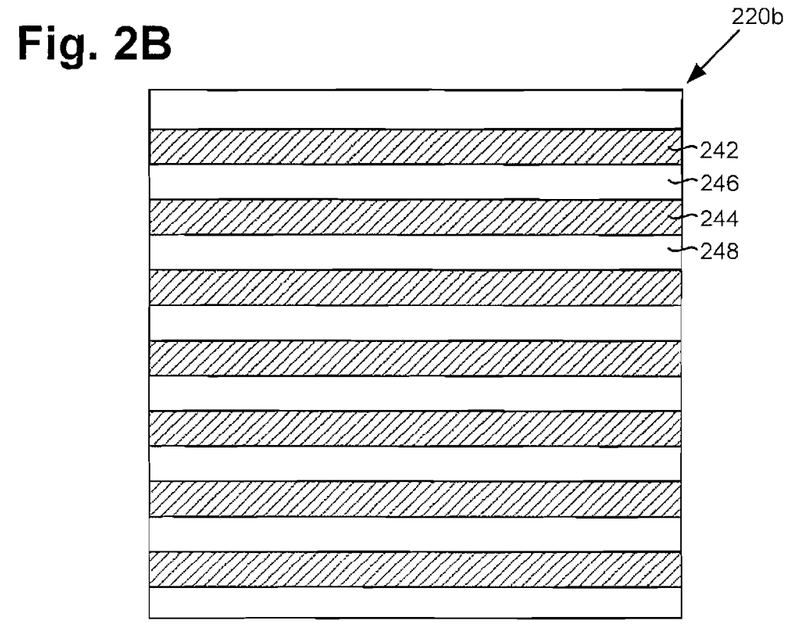
FIG. 2B illustrates an exemplary top view of a photoresist layer after a first exposure utilizing the grating mask, in accordance with one implementation of the present application.

FIG. 2B illustrates an exemplary top view of a photoresist layer after a first exposure utilizing the grating mask, in accordance with one implementation of the present application. Such an exposure may produce several exposed lines shown in photoresist layer 220b, such as exposed lines 246 and 248. Each of the exposed lines may be separated from an adjacent exposed line by an unexposed line in the photoresist layer, such as unexposed lines 242 and 244. The width of unexposed lines 242 and 244 may be controlled by the width of the grating lines of the grating mask. The width of unexposed lines 242 and 244 may additionally be controlled by adjusting the exposure time and/or exposure power for photoresist layer 220a while utilizing the grating mask of FIG. 2A. For example, utilizing positive photoresist, the width of each of the unexposed lines may be reduced by overexposing the photoresist layer. Thus, the width of the grating lines may be larger or smaller than the width, or CD, of the lines produced by the grating mask.

Figure 2C:
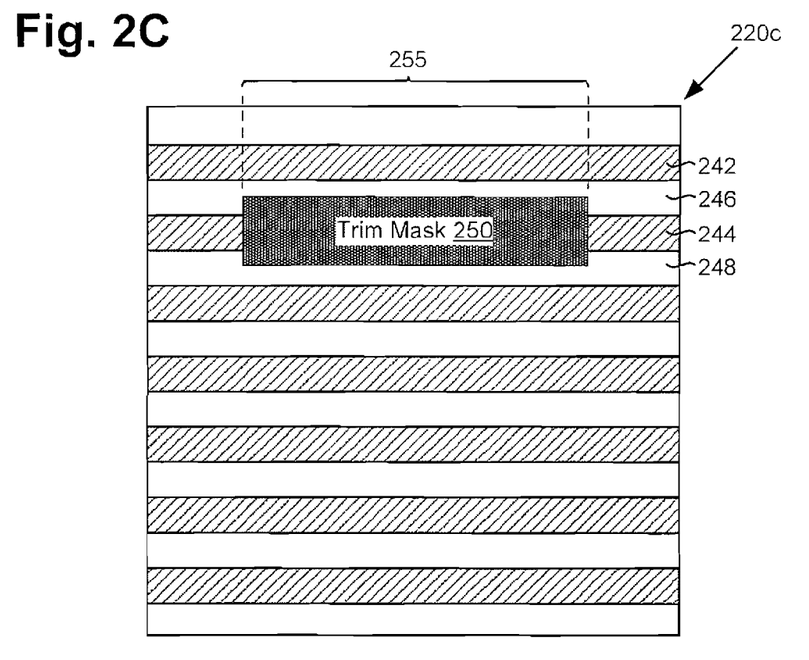
FIG. 2C illustrates an exemplary top view of a photoresist layer with the application of a trim mask, in accordance with one implementation of the present application.

FIG. 2C illustrates an exemplary top view of a photoresist layer with the application of a trim mask, in accordance with one implementation of the present application. Specifically, trim mask 250 may have one or more blocking portions 255 situated over one of the unexposed lines, for example, unexposed line 224. Once the trim mask is secured in place, photoresist layer 220c may be exposed to the appropriate exposure radiation for a second time.

Figure 2D:
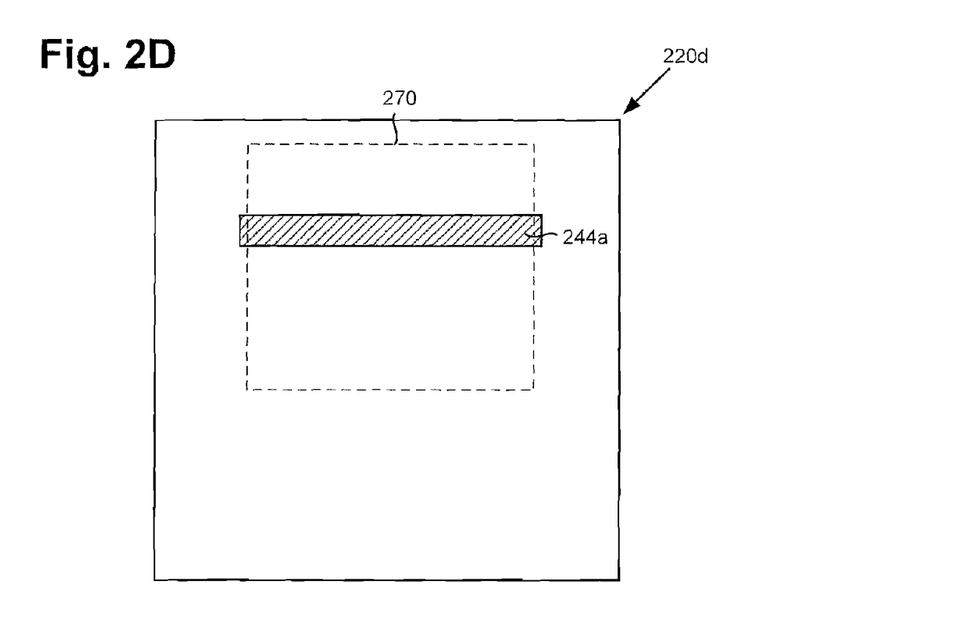
FIG. 2D illustrates an exemplary top view of a photoresist layer after a second exposure utilizing the trim mask, in accordance with one implementation of the present application.

FIG. 2D illustrates an exemplary top view of a photoresist layer after a second exposure utilizing the trim mask, in accordance with one implementation of the present application. Such exposure may cause only the portion of unexposed line 244 of FIG. 2C situated under blocking portion 255 of trim mask 250 to remain unexposed. Such a remaining unexposed line is shown as unexposed line 244a. Thus, a photoresist layer may be exposed utilizing a grating mask and then without developing the photoresist the photoresist layer may be exposed a second time utilizing a trim mask. Once double-exposed photoresist layer 220d is developed, unexposed line 244a will have a CD as narrow as one-half of the CD possible if a grating mask was not used due to the effects of exposure radiation interference and partial diffraction.

Figure 3A:
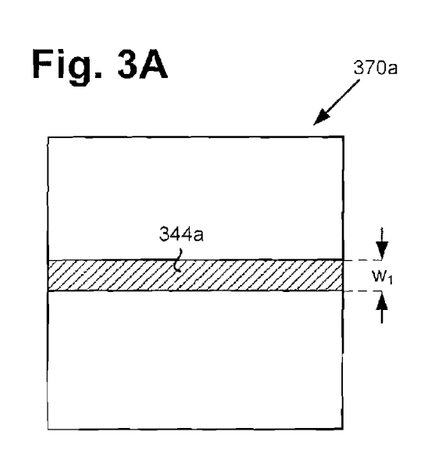
FIG. 3A illustrates an exemplary zoomed top view of photoresist layer after a second exposure utilizing the trim mask, in accordance with one implementation of the present application.
Figure 3B:
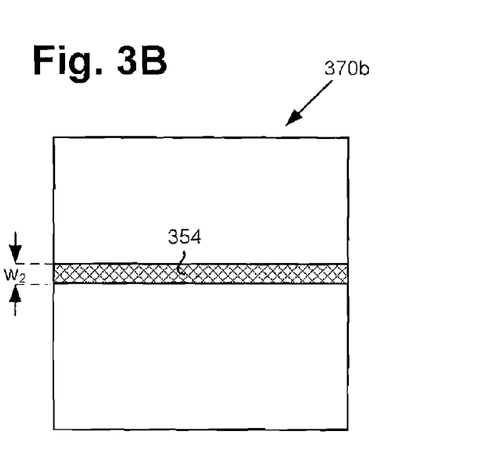
FIG. 3B illustrates an exemplary zoomed top view of an etched line formed by a subsequent etch of a semiconductor wafer underlying a photoresist layer, in accordance with one implementation of the present application.

Once a single unexposed line is formed, its CD may be further narrowed by etching. FIG. 3A illustrates an exemplary zoomed top view 370a of photoresist layer 220d after a second exposure utilizing the trim mask, in accordance with one implementation of the present application. For example, top view 370a illustrates the portion of photoresist layer 220d bounded by the dashed box 270 in FIG. 2D, where line 334a is shown after photoresist exposure and development having a width $w_1$ of 140 nm, for example. FIG. 3B illustrates zoomed top view 370b showing etched line 354, which may have a width $w_2$ of 115 nm, for example, formed by a subsequent etch of the underlying semiconductor wafer after double-exposure of the photoresist layer. In this way, a further narrowing of features formed utilizing the 2-step grating/trim mask technique of the present application may be obtained.

Figure 4:
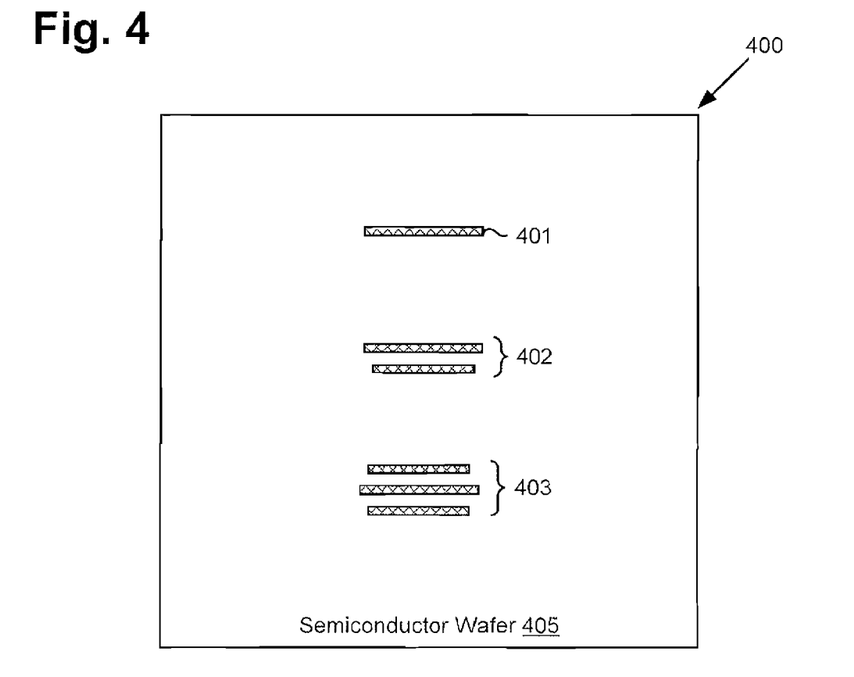
FIG. 4 illustrates several features obtained utilizing trim masks of varying dimension, in accordance with one implementation of the present application.

An added benefit of this 2-step grating/trim mask technique is a relaxation of the dimension and alignment requirements of the trim mask. Because exposure through the grating mask results in exposed lines on either side of a particular unexposed line, the width of the blocking portion of the trim mask may be larger than the grating lines of the grating mask. Accordingly, a blocking portion of the trim mask may be as large as possible while only masking a single line formed by the grating mask exposure. FIG. 4 illustrates several features obtained utilizing trim masks of varying dimension, in accordance with one implementation of the present application. For example, view 400 shows the effect of a grating mask first utilized to form unexposed lines having a width of 150 nm and a pitch of 330 nm between adjacent unexposed lines on semiconductor wafer 405, for example. Line 401 illustrates the result of utilizing a trim mask having a width of between 450 nm and 600 nm. For line 401, the trim mask is narrow enough to only mask a single unexposed line.

However, as the width of the trim mask increases, additional unexposed lines may be undesirably masked. As shown by etched lines 402, a trim mask having a width of 650 nm is utilized, which was sufficiently wide to mask two adjacent unexposed lines resulting in the etching of both adjacent unexposed lines into etched lines 402. Likewise, lines 403 were formed utilizing a trim mask having a width of 700 nm, which was sufficiently wide to mask three adjacent unexposed lines, resulting in the etching of all three adjacent unexposed lines into etched lines 403. Thus, the width of the blocking portions of the trim mask may be chosen according to the requirements of a particular application with regard to the width and pitch of exposed and unexposed lines formed by the grating mask.

In addition, as the dimensions of semiconductor features decrease, the need to achieve precise focus of the mask image becomes more important. Further exacerbating the focus issue is the fact that lines formed in photolithography masks are not perfect. Variations in lines projected onto the photoresist layer cause a proportional variation in etched lines. The mask error function (MEF) is the ratio of the variation in width of a feature formed on a wafer to the variation in the width of that feature on the mask itself. Conventional photolithographic techniques achieve MEFs of approximately 2.0. Thus, any imperfections on the mask are magnified by a factor of 2.0 in the transfer to the wafer using conventional techniques. A solution to both the focus and MEF issues may be the implementation of a phase shifting mask for the grating mask and/or the trim mask.

Figure 5:
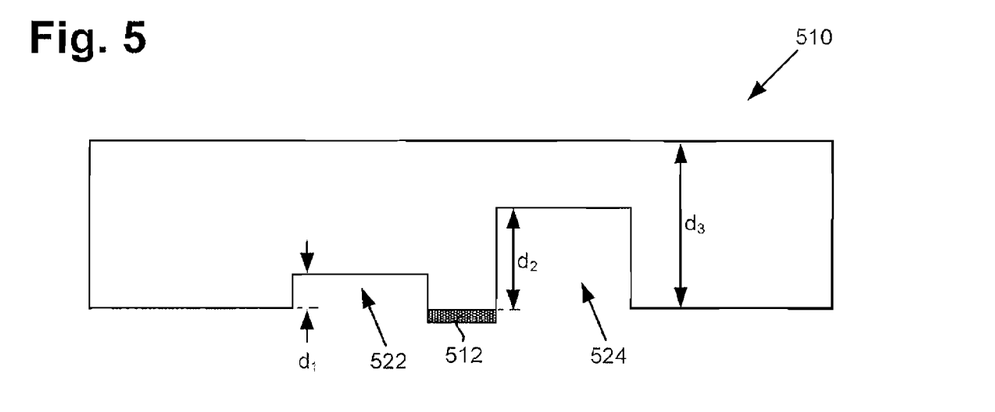
FIG. 5 illustrates a phase shifting mask for fabricating a semiconductor device, in accordance with one implementation of the present application.

FIG. 5 illustrates a phase shifting mask for fabricating a semiconductor device, in accordance with one implementation of the present application. FIG. 5 may include phase shifting mask 510 having chrome line 512, which may correspond to any grating line of a grating mask or blocking portion of a trim mask as described above. Phase shifting mask 510 may additionally include first recess 522 adjacent to chrome line 512 and second recess 524 adjacent to chrome line 512 on a side opposite of first recess 522. First recess 522 and second recess 524 may be etched during a mask-making process such that first recess 522 has a first depth $d_1$ and second recess 524 has a second depth $d_2$.

By controlling the thickness of the mask within recesses 522 and 524, the phase of the exposure radiation passing through those portions of the mask may be adjusted. Accordingly, $d_1$ and $d_2$ may be chosen such that exposure radiation of a predetermined frequency passing through the first recess and exposure radiation passing through the second recess are 180° out of phase with each another. For example, exposure radiation passing through the entire mask thickness $d_3$ may have a relative phase of 0°. $d_1$ may be chosen such that exposure radiation passing through first recess 522 is phase shifted by 90°. Similarly, $d_2$ may be chosen such that exposure radiation passing through second recess 524 is phase shifted by 270°, creating a relative phase shift between first and second recesses of 180°. However, the present application is not limited to the above phase shifts, but may include any two phase shifts through the first and second recesses that are 180° out of phase with one another.

Exposure radiation passing through the different thicknesses of phase shift mask 510 may cause interference and partial diffraction, resulting in a higher contrast and a sharper photoresist image than would be possible without the use of a phase shift grating mask. Thus, the use of a phase shift mask for the grating mask may increase the focus of projected masking images. In addition, use of a phase shift mask: increases the usable process window at very small CDs, increases the range of CDs available from a single mask through overexposure or underexposure, and reduces the mask error function as compared to conventional binary masks. For example, at least one experiment utilizing a phase shift mask applied to a grating mask of the present application produced a mask error function of less than 0.38. Thus, instead of magnifying mask imperfections by a factor of 2.0 as with conventional photolithographic techniques, the present inventive concepts may reduce the impact of mask imperfections by a factor of more than 2.5.

In addition, fabrication of very small features at the limits of conventional photoresist exposure techniques results in very small process windows. Using a grating mask to produce a dense collection of grating lines produces increased exposure latitude as well as a much larger depth of focus, compared to the conventional technique of defining single narrow lines in a mask. This may be attributed to the increased interference and partial diffraction experienced when closely packed grating lines in the grating mask are used.

Figure 6:
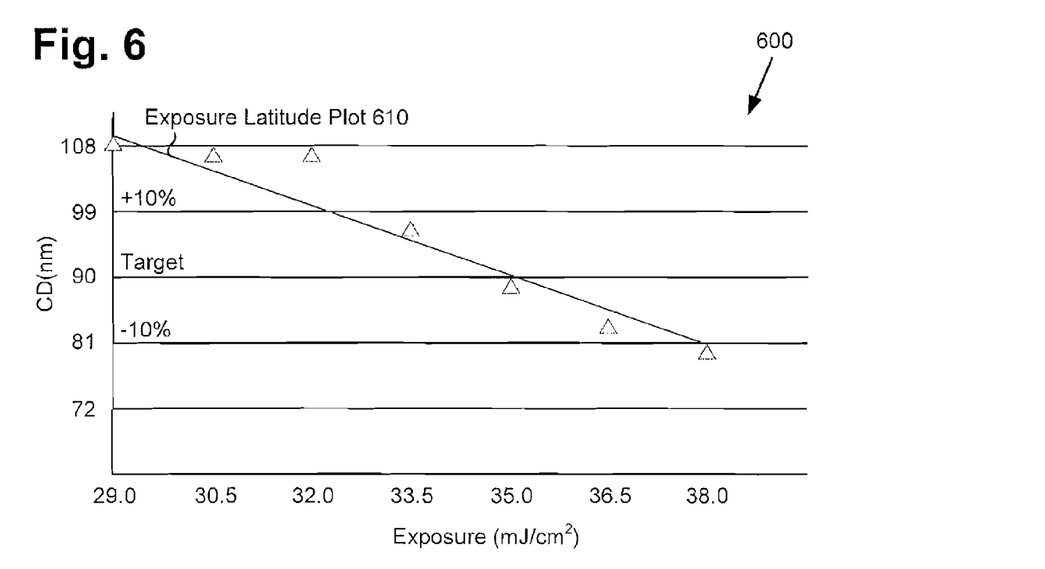
FIG. 6 illustrates an exemplary graph showing photoresist exposure latitude while fabricating a semiconductor device, in accordance with one implementation of the present application.

FIG. 6 illustrates an exemplary graph showing photoresist exposure latitude while fabricating a semiconductor device, in accordance with one implementation of the present application. For example, graph 600 illustrates an exposure latitude plot 610 showing feature widths produced as a result of several grating mask exposures at varying exposure powers, followed by a control trim mask exposure at a power of 20 mJ/cm². Exposure latitude is the range of exposure power that may be used to achieve a feature having a CD within a specified tolerance. For example, FIG. 6 shows fabrication of a line having a target CD of 90 nm with a tolerance of ±10%. According to FIG. 6, during the grating mask phase any exposure power between approximately 32.5 mJ/cm² and 38.0 mJ/cm² may be applied to produce a line having a CD of 90 nm±10%, yielding an exposure latitude of approximately 15%. In addition, a particular CD may be achieved by varying exposure power over grating lines having varying CDs. Thus, the present inventive concepts may allow increased flexibility in both applied exposure power and choice of grating line CD.

Figure 7:
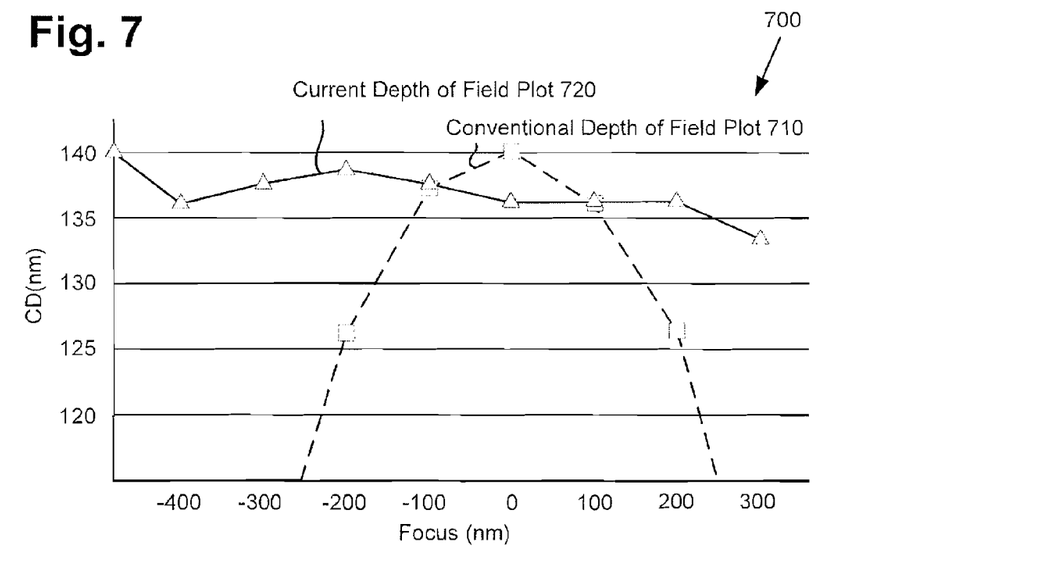
FIG. 7 illustrates an exemplary graph showing depth of field while fabricating a semiconductor device, in accordance with one implementation of the present application.

FIG. 7 illustrates an exemplary graph showing depth of field while fabricating a semiconductor device, in accordance with one implementation of the present application. More specifically, FIG. 7 shows graph 700 comparing a simulated conventional depth of field (DOF) plot 710 with a DOF plot 720 of a system in accordance with an implementation of the present application. The conventional system may utilize a single isolated line projected onto a photoresist layer, while the system in accordance with an implementation of the present application may utilize a grating mask having many closely-spaced grating lines projected onto a photoresist layer. FIG. 7 may show the DOF for fabrication of an emitter post having a CD of 140 nm with a tolerance of ±10 nm. As shown by FIG. 7, the conventional DOF plot 710 is within tolerance only between focus distances of from approximately −170 nm to approximately +170 nm, having a DOF of approximately 340 nm. However, the DOF plot 720 of a system in accordance with an implementation of the present application is within tolerance at least between focus distances of −400 nm to more than the point of resist loss at +200 nm, having a DOF of greater than 600 nm. In some applications, the range of focus of the present inventive concepts may be between 2 and 5 times that of conventional single line masking processes.

Thus, by choosing an appropriate grating line size and pitch for the emitter layer, for example, the same grating mask may be used in the fabrication of multiple semiconductor layers. For example, the same grating mask may be used in conjunction with separate trim masks to form several layers of a device structure. In such an application, only one extra reticle would be required to enable more aggressive CDs for as many as 5 or more masking steps. In addition, because the same photoresist layer is exposed utilizing multiple masks, added costs associated with wafer processing are negligible. Additionally, combined with the use of both positive and negative photoresist layers, features such as emitter posts (EM) and emitter windows (EW), respectively, may be fabricated using the same grating mask. The present inventive concepts also reduce registration error associated with alignment of several different masking layers due to the multiple uses of the same grating mask. Reduction in registration error is beneficial since, in many applications, tight overlays may be more critical for performance of the devices than the absolute values of feature CDs.

In addition, since the emitters of bipolar transistors in analog designs are almost always separated by at least several tenths of a micron, a single grating pitch may allow for trim masks having relatively relaxed dimensions. The present inventive concepts may additionally provide relatively flexible circuit design since emitters need only fall on a grid of some integer multiple of the grating pitch for their fabrication. In fact, a single grating mask may be used multiple times in different layouts so long as the circuit design places the emitters on a pre-defined grid. Also, as previously stated, overexposure and underexposure of the grating mask may allow for fabrication of narrower or wider CDs than the grating line widths. Thus, the added cost involved to enable such advanced CDs to a BiCMOS technology, for example, would be almost negligible. Utilizing the same grating mask for multiple layers may provide reduced mask costs as well as improved alignment by eliminating mask registration errors, which increases process margin.

Figure 8:
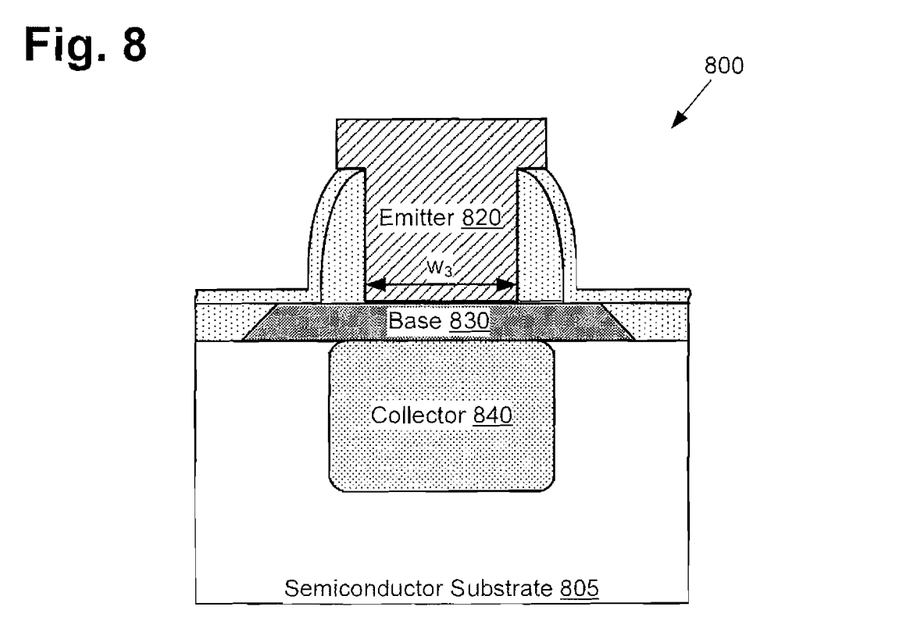
FIG. 8 illustrates an exemplary vertical heterojunction bipolar transistor (HBT) fabricated in accordance with one implementation of the present application.

FIG. 8 illustrates an exemplary vertical heterojunction bipolar transistor (HBT) fabricated in accordance with one implementation of the present application. More specifically, HBT 800 may include emitter 820, base 830 and collector 840. In one implementation, several of the above-mentioned HBT features may be fabricated utilizing a single grating mask. For example, the emitter typically represents the CD of HBT 800, having the narrowest dimension. In a conventional design, the width $w_3$ of emitter 820 may be approximately 130 nm, near the limits of current applicable photolithographic techniques. However, utilizing the present inventive concepts, $w_3$ may be made as narrow as 50 nm. The widths of base 830 and collector 840 may similarly be reduced using the above described grating mask techniques. Most importantly, the present inventive concepts allow for each of these features to be fabricated utilizing the same grating mask. For example, a grating mask may be fabricated having a grating line width and pitch suitable to fabricate collector 840 at designed tolerances. For each layer, overexposure or underexposure of the grating mask may be used to provide a feature width narrower or wider, respectively, than that of collector implant 840. If necessary, an additional etch may be utilized to further reduce the CD of a particular feature. For example, the emitter may be etched, if necessary, to reduce its CD to 50 nm. At each layer, a different trim mask may be applied after exposure with the grating mask to define the lengths of each of the features according to design requirements. Thus, the present inventive concepts allow for the fabrication of multiple features having various widths narrower than those achievable by the capabilities of current techniques. Such methods may be useful in any application where semiconductor components may be laid out in a predetermined grid formation, or where multiple features must be fabricated vertically one over the other.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A method for fabricating a semiconductor device, said method comprising:
exposing a photoresist layer disposed on a semiconductor wafer utilizing a grating mask having a plurality of grating lines to produce exposed lines and unexposed lines in said photoresist layer;
exposing said photoresist layer utilizing a trim mask having a chrome line in a blocking portion situated over a selected one of said unexposed lines, wherein said trim mask includes at least two recesses having different depths adjacent to said chrome line, and wherein said chrome line is aligned with respective sidewalls of said at least two recesses.

2. The method of claim 1, further comprising developing said photoresist layer after said exposing said photoresist layer utilizing said trim mask.

3. The method of claim 1, further comprising controlling a width of said unexposed lines by adjusting an exposure time of said photoresist layer while utilizing said grating mask.

4. The method of claim 1, further comprising controlling a width of said unexposed lines by adjusting an exposure power for said photoresist layer while utilizing said grating mask.

5. The method of claim 1, wherein said photoresist layer comprises a positive photoresist.

6. The method of claim 5, further comprising etching a line into said semiconductor wafer where said selected one of said unexposed lines was blocked by said blocking portion of said trim mask.

7. The method of claim 1, wherein said photoresist layer comprises a negative photoresist.

8. The method of claim 1, wherein said grating mask comprises an alternating phase shift mask.

9. The method of claim 1, wherein said grating mask comprises an alternating phase shift mask, said alternating phase shift mask comprising:
a chrome line to function as one of said plurality of grating lines;
a first recess having a first depth and situated adjacent to said chrome line;
a second recess having a second depth and situated adjacent to said chrome line on a side opposite of said first recess.

10. The method of claim 9, wherein radiation passing through said first recess is approximately 180 degrees out of phase with radiation passing through said second recess.

11. A semiconductor wafer fabricated by a method comprising:
exposing a photoresist layer disposed on said semiconductor wafer utilizing a grating mask having a plurality of grating lines to produce exposed lines and unexposed lines in said photoresist layer;
exposing said photoresist layer utilizing a trim mask having a chrome line in a blocking portion situated over a selected one of said unexposed lines, wherein said trim mask includes at least two recesses having different depths adjacent to said chrome line, and wherein said chrome line is aligned with respective sidewalls of said at least two recesses.

12. The semiconductor wafer of claim 11, wherein said photoresist layer is developed after said exposing said photoresist layer utilizing said trim mask.

13. The semiconductor wafer of claim 11, wherein a width of said unexposed lines is controlled by adjusting an exposure time of said photoresist layer while utilizing said grating mask.

14. The semiconductor wafer of claim 11, wherein a width of said unexposed lines is controlled by adjusting an exposure power for said photoresist layer while utilizing said grating mask.

15. The semiconductor wafer of claim 11, wherein said photoresist layer comprises a positive photoresist.

16. The semiconductor wafer of claim 15, wherein a line is etched into said semiconductor wafer where said selected one of said unexposed lines was blocked by said blocking portion of said trim mask.

17. The semiconductor wafer of claim 11, wherein said photoresist layer comprises a negative photoresist.

18. The semiconductor wafer of claim 11, wherein said grating mask comprises an alternating phase shift mask.

19. The semiconductor wafer of claim 11, wherein said grating mask comprises an alternating phase shift mask, said alternating phase shift mask comprising:
- a chrome line to function as one of said plurality of grating lines;
- a first recess having a first depth and situated adjacent to said chrome line;
- a second recess having a second depth and situated adjacent to said chrome line on a side opposite of said first recess.

20. The semiconductor wafer of claim 19, wherein radiation passing through said first recess is approximately 180 degrees out of phase with radiation passing through said second recess.

* * * * *